United States Patent
Hirata et al.

(10) Patent No.: US 6,459,161 B1
(45) Date of Patent: *Oct. 1, 2002

(54) SEMICONDUCTOR DEVICE WITH CONNECTION TERMINALS IN THE FORM OF A GRID ARRAY

(75) Inventors: Masayoshi Hirata, Tokyo (JP); Yasuhiro Suzuki, Tokyo (JP); Tetsuya Hiraoka, Kawasaki (JP); Mitsutaka Sato, Kawasaki (JP)

(73) Assignees: NEC Corporation, Tokyo (JP); Fujitsu Limited, Kanagawa (JP); Kabushiki Kaisha Toshiba, Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/437,899

(22) Filed: Nov. 9, 1999

(30) Foreign Application Priority Data

Nov. 10, 1998  (JP) .............................. 10-336522

(51) Int. Cl.$^7$ .............................................. H01L 23/48
(52) U.S. Cl. ........................ 257/786; 257/737; 257/738
(58) Field of Search ................ 257/737, 786, 257/666, 723, 724, 725

(56) References Cited

U.S. PATENT DOCUMENTS

| | | | |
|---|---|---|---|
| 4,990,996 A | 2/1991 | Kumar et al. ................ | 357/68 |
| 5,334,857 A | * 8/1994 | Mennitt ........................ | 258/48 |
| 5,528,083 A | * 6/1996 | Malladi | |
| 5,729,894 A | 3/1998 | Rostoker et al. .............. | 29/832 |
| 5,796,169 A | 8/1998 | Dockerty et al. ........... | 257/780 |
| 5,801,447 A | * 9/1998 | Hirano ........................ | 257/778 |
| 5,828,128 A | * 10/1998 | Higashiguchi .............. | 257/738 |
| 5,886,876 A | * 3/1999 | Yamaguchi .................. | 361/767 |
| 5,923,540 A | * 7/1999 | Asada .......................... | 361/794 |
| 5,973,406 A | * 10/1999 | Harada ........................ | 257/780 |
| 6,107,685 A | * 8/2000 | Nishiyama .................. | 257/737 |
| 6,157,085 A | * 12/2000 | Terashima .................. | 257/783 |

FOREIGN PATENT DOCUMENTS

| | | | |
|---|---|---|---|
| JP | 357015455 A | * | 1/1982 |
| JP | 58-53837 | | 3/1983 |
| JP | 1-217931 A | | 8/1989 |
| JP | 3-38737 | | 6/1991 |
| JP | 7-245360 A | | 9/1995 |
| JP | 08-46313 | | 2/1996 |
| JP | 10-92965 | | 4/1998 |
| JP | 10-270839 | | 10/1998 |

* cited by examiner

Primary Examiner—Olik Chaudhuri
Assistant Examiner—Nathan W. Ha
(74) Attorney, Agent, or Firm—Sughrue Mion, PLLC

(57) ABSTRACT

The semiconductor device of the present invention with an IC chip provided on one side of a substrate, comprises a plurality of connection terminals, which are provided on the other side of the substrate, are electrically connected to the IC chip through electrical connecting devices, form a rectangular grid array, and are arranged in positions other than corners of the array.

14 Claims, 9 Drawing Sheets

PRIOR ART

FIG.10

SEMICONDUCTOR DEVICE WITH CONNECTION TERMINALS IN THE FORM OF A GRID ARRAY

BACKGROUND OF THE INVENTION

1. Field of the Invention

The present invention relates to a semiconductor device with connection terminals in a grid array.

This application is based on Japanese Patent Application No. 10-336522, the contents of which are incorporated herein by reference.

2. Description of the Related Art

In recent years, as the functions of electronic devices have been improved and their sizes have been reduced, it has become necessary to install semiconductor devices on a board at a high density.

Figure 10:
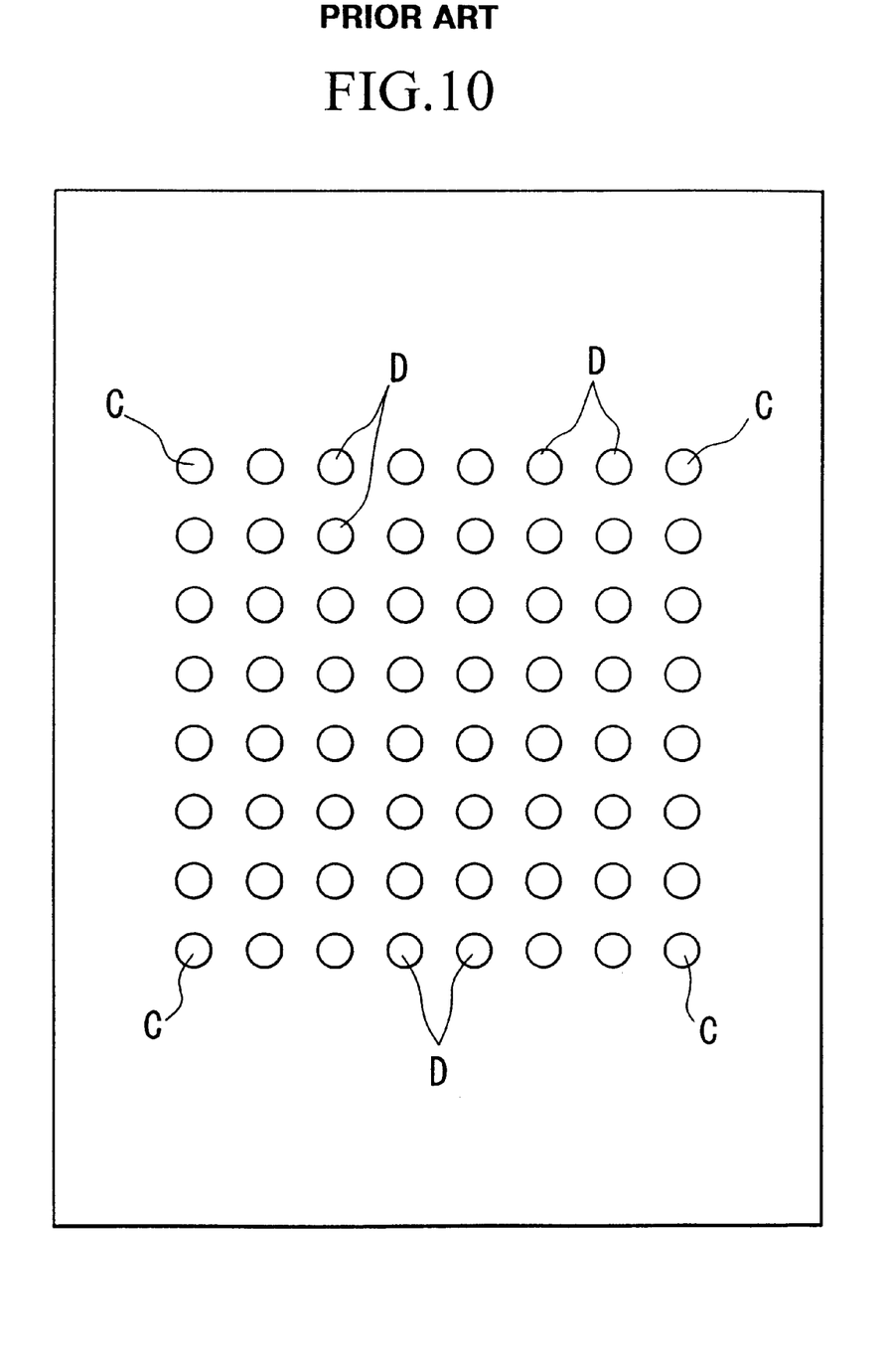
FIG. 10 is a bottom view showing the arrangement of bump electrodes of the conventional semiconductor device.

To install the semiconductor devices on the board at a high density, BGA semiconductor devices, shown in FIG. 10, have bump electrodes C and D, such as solder balls, on the underside of a substrate to which a semiconductor device is to be mounted. FIG. 10 shows the underside of the BGA semiconductor device to be mounted on the board.

The package of the BGA (ball grid array) semiconductor device (hereinafter referred to as the "BGA package") has approximately the same size as a semiconductor chip, and is called a chip size package (CSP).

The BGA packages are used for various purposes, i.e., for logic LSIs (Large Scale Integration) such as a microcomputer, and ASICs (Application Specific Integrated Circuits). These logic LSIs may have different functions, depending on their types, i.e., different numbers of external terminals and various functions.

The number of the external terminals may be several hundreds, and a number of metal balls are arranged along the edges of the BGA package. The logic LSIs allow flexibility in designing the pin arrangement irrespective of the compatibility of the external terminals.

Meanwhile, generalized products, such as memories, have almost the same functions. Therefore, when the pin arrangement is predefined, the memories can be mounted irrespective of their manufacturer or storage capacity.

Even when the storage capacity is increased or the number of address lines or data lines is increased, the pin arrangement may be defined in expectation of increases in storage capacity. Then, the memory can be mounted in the same package without changing the pin arrangement. The pins are arranged around the center of the package in the form of a grid array. Even when the number of address lines or data lines is increased, a new grid pin may be only added around the array so that the original pin arrangement can be maintained. Thus, there are differences between logic LSIs and the generalized products.

The bump electrodes C at the four corners on the underside of the BGA semiconductor device, however, are affected by thermal stress, more than on other bump electrodes D, due to variation in temperature and a difference in coefficient of thermal expansion between the board and the substrate. The thermal stress may cause electrical or mechanical disconnection of the bump electrodes C between the mount board and the substrate.

Moreover, the bump electrodes C may receive impacts, more than the other bump electrodes D, due to dropping or bumping of the semiconductor device. The impact may cause electrical or mechanical disconnection of the bump electrodes C between the mount board and the substrate.

To avoid this, Japanese Patent Application, Second Publication No. Hei 3-38737 (hereinafter referred to as the "background art 1") discloses reinforcing the bump electrodes C at the four corners of the array. Another background art (hereinafter referred to as the "background art 2") discloses the technique using all the outermost bump electrodes C and D for reinforcement.

Because in the background art 1 the reinforcing bump electrodes are positioned at the four corners, stress may be concentrated on the bump electrodes, and they may be accidentally disconnected. Therefore, the reinforcing bump electrodes cannot achieve their purpose.

According to the background art 2, the reinforcing bump electrodes improve the strength. However, to connect the electrodes enclosed by the bump electrodes to a external device, many signal lines must be provided between the bump electrodes. As the number of the signal lines is increased, the signal lines must be thinner. Because of the thin signal lines, the resistance increases so that the electric characteristics deteriorate. The thin signal lines are easy to disconnect during a normal manufacturing process or when using a normal substrate material. To manufacture the thin signal lines, a process or a material suitable for fine manufacturing is indispensable, thus increasing the manufacturing costs.

Moreover, when all the outermost electrodes are reinforcing bump electrodes, the number of reinforcing balls increases, thus increasing the costs.

When the bump electrodes are provided around the center of the grid array balls, it is difficult to provide the signal lines between the electrodes, as described above. Even when the bump electrodes are provided around the center, stress does not frequently occur around this area, and therefore these bump electrodes may be ineffective. Meanwhile, the number of the bump electrodes is increased, thus increasing the costs.

BRIEF SUMMARY OF THE INVENTION

It is therefore an object of the present invention to provide a semiconductor device which can reliably connect bump electrodes to a mount board.

In one aspect of the invention, in the semiconductor device with an IC chip provided on one side of a substrate, a plurality of connection terminals are provided on the other side of the substrate, are electrically connected to the IC chip through electrical connecting devices, form a rectangular grid array, and are arranged in positions other than corners of the array. Additional terminals may be provided outside the grid array.

In another aspect of the invention, a plurality of connection terminals are provided on the second side of the substrate, are electrically connected to the IC chip, form a rectangular grid array, and additional terminals are provided outside the grid array.

The connection terminals are conductors electrically and mechanically connected to a board to which the semiconductor device is mounted. The conductors are made of solder or tin alloy. The additional terminals are made of non-conductive material.

The connection terminals are spherical, and parts of the spheres protrude from the second side of the substrate. Some of the connection terminals are not electrically connected to the IC chip.

The additional terminals are aligned along at least one of the row direction and the column direction. The connection terminals are excluded from the center of the grid array.

The connection terminals are arranged at a regular pitch P. The additional terminals are arranged at an interval of integer multiple of the pitch P or division of the pitch P by integer. An interval between the connection terminals and the additional terminal is integer multiple of P or division of P by integer.

At least one of the additional terminals is electrically connected to the IC chip. At least one of the additional terminals is an index terminal. The connection terminals are electrically connected to the IC chip through conductors provided in the substrate.

DETAILED DESCRIPTION OF THE INVENTION

Figure 1A:
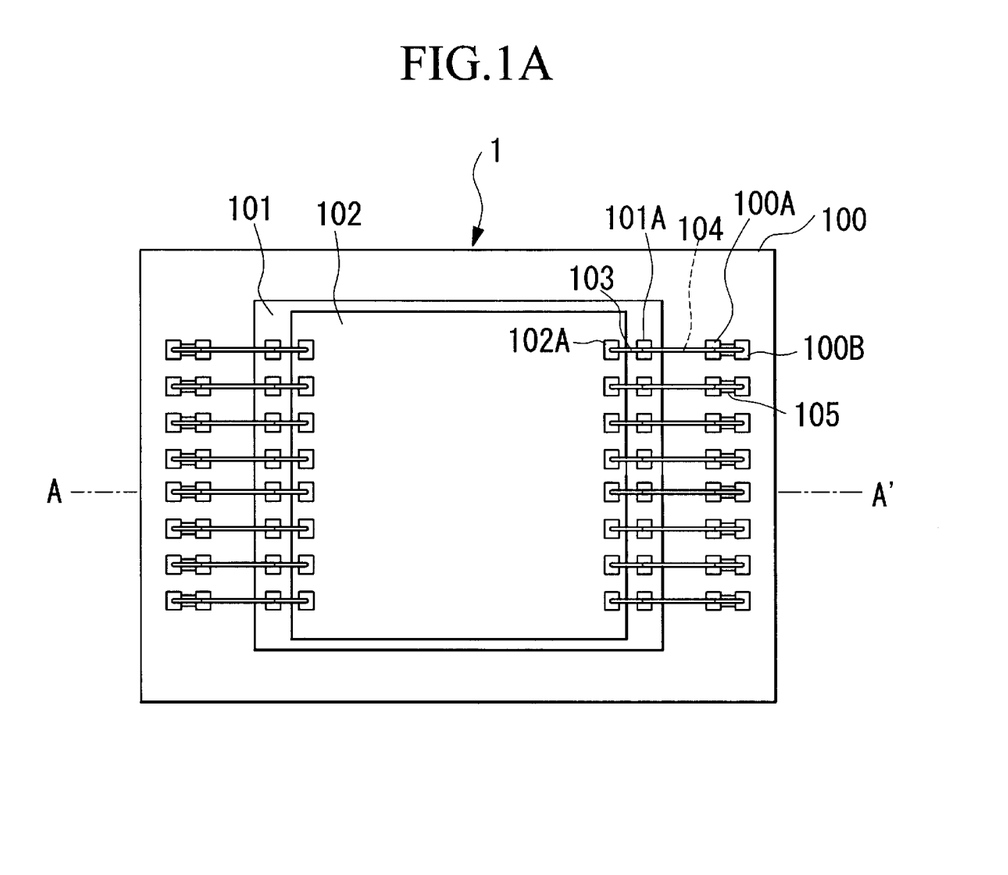
FIGS. 1A and 1B are schematic diagrams showing the inside structure of the semiconductor device of the present invention.
Figure 1B:
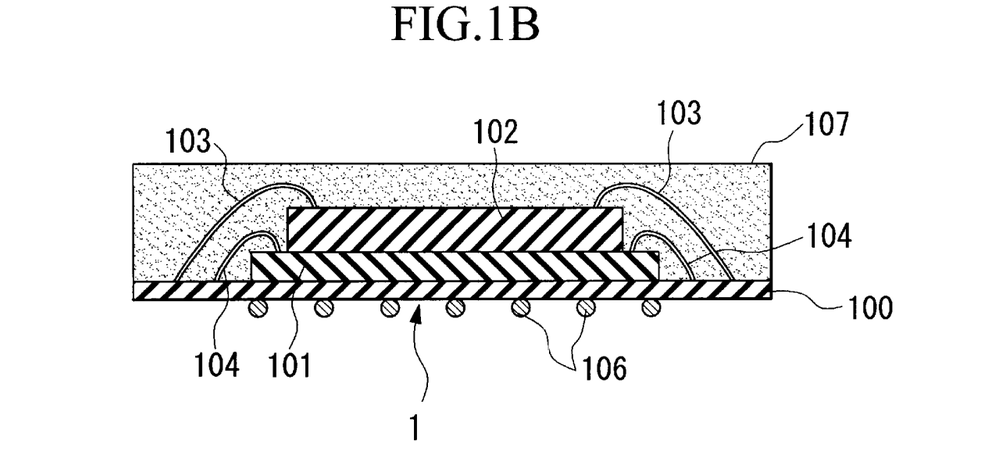

The embodiment of the present invention will be explained with reference to the figures. FIGS. 1A and 1B are schematic diagrams showing the structure of the semiconductor device 1 of the embodiment. While in the semiconductor device 1 a flash memory chip and SRAM (static random access memory) are stacked on a substrate 100 in a stack MCP (multi-chip package), forming a single package, the invention is not limited to this, and only a single chip may be mounted. FIG. 1A shows a top view of the inside of the package of the semiconductor device 1, and FIG. 1B shows a cross-sectional view from line A–A'.

In these figures, reference numeral 101 denotes a SRAM chip, on which the flash memory chip 102 is mounted. The relationship of the stacked upper and lower chips is not limited to this as long as the larger chip lies below the other chip. By stacking the chips, the size of the semiconductor device 1 is considerably reduced. For instance, the device occupies only 30 percent of the mounting area of a conventional TSOP (Thin Small Outline Package) with a single SRAM chip and a single flash memory.

In the SRAM chip 101 and the flash memory 102, most of the pairs of bonding pads 10A and 102A overlapping each other are designed to output the same signals, respectively. That is, the bonding pads 101A of the SRAM chip 101 and the bonding pads 102A of the flash memory 102, which input or output address signals or data signals, are located close to each other (approximately at the same positions), respectively, in view of the pin assignment and the optimization of signal patterns. The pads for control signals, such as a RESET signal or a chip enable (CE) signal, can be connected separately.

Reference numeral 103 denotes bonding wires made of a conductor such as gold, copper, or aluminum, which electrically connect the bonding pads 102A and the bonding pads 100B on the surface of the substrate 100. Reference numeral 104 denotes other bonding wires made of a conductor such as gold, copper, or aluminum, which electrically connect the bonding pads 101A and the bonding pads 100A on the surface of the substrate 100. The bonding pads 100A and 100B are connected by signal lines 105 of conductor (copper, a plated layer of nickel, tin, or gold, or copper with plating layers of a combination thereof) formed on the upper surface of the substrate 100.

Reference numeral 106 denotes metal balls, which are electrically connected to the signal lines 105, and establish electrical connections between the signal lines 105 and signal lines on a mount board which is not shown. The metal balls 106 are made of metal such as solder, tin alloy, or gold, or another electrically connectable material such as carbon, or a conductive film. The metal balls are not limited to the spherical shape, and may have hemispherical or cylindrical shapes. The metal balls 106 are made of solder, tin alloy, or gold. Reference numeral 107 denotes a sealing resin which protects the SRAM chip 101, the flash memory chip 102, the bonding wires 103, and the bonding pads from moisture or the like.

Figure 2:
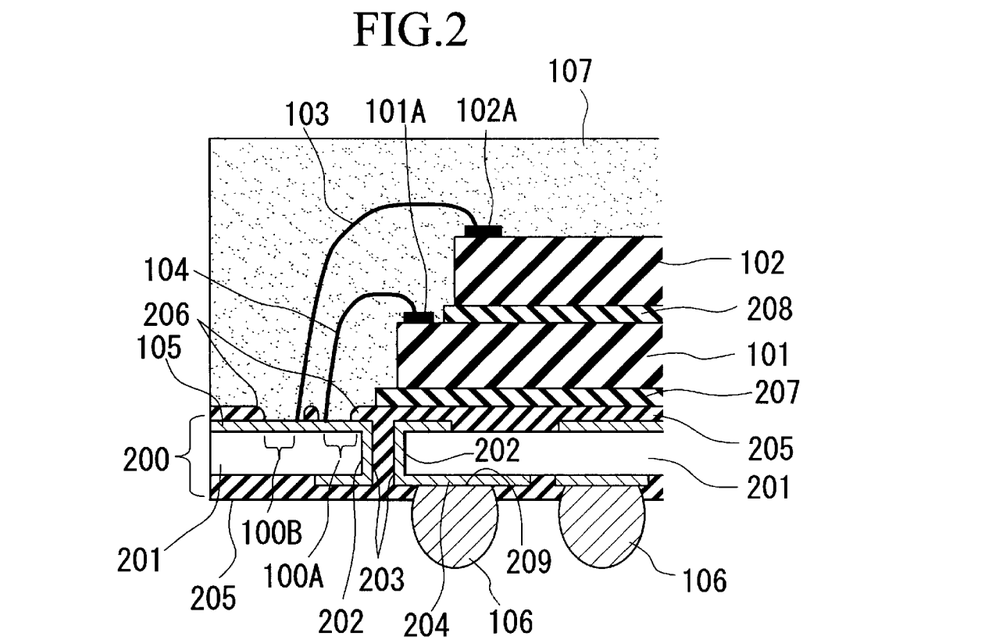
FIG. 2 is a schematic diagram showing the package structure of a stack MCP using a PCB substrate in the semiconductor device of the present invention.
Figure 3:
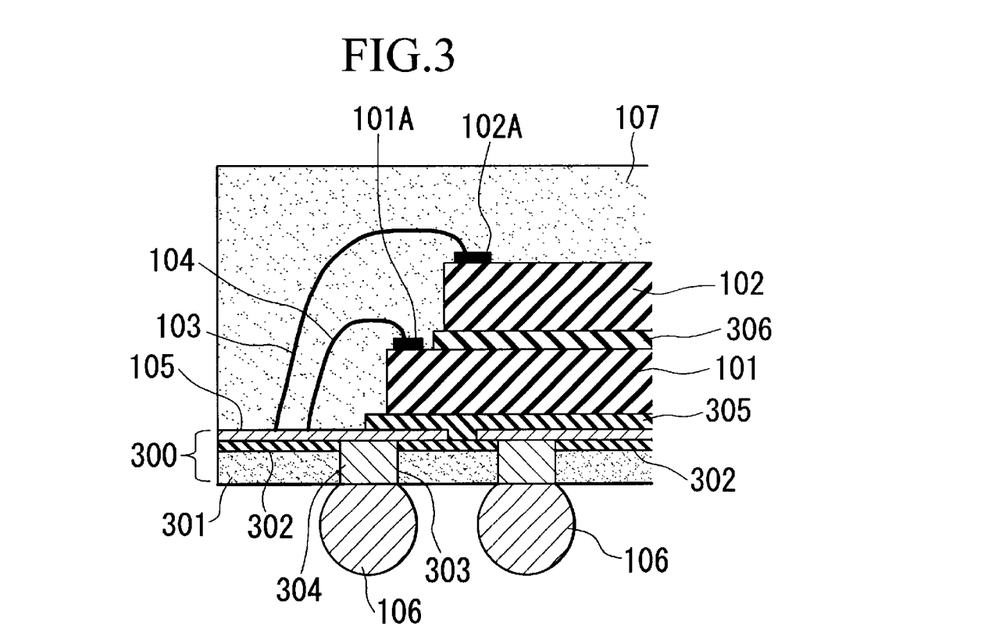
FIG. 3 is a schematic diagram showing the package structure of a stack MCP using a tape substrate in the semiconductor device of the present invention.

Referring to FIGS. 2 and 3, the connection structure between the metal balls 106 and the signal lines 105 will be explained. The substrate 100 may be a tape, or a PCB (printed circuit board). FIG. 2 shows the connection structure of the PCB with the metal balls 106 and the signal lines 105. FIG. 3 shows the connection structure of the tape with the metal balls 106 and the signal lines 105.

Initially, the connection structure shown in FIG. 2 will be described. In this figure, reference numeral 200 denotes the PCB corresponding to the substrate 100 of the semiconductor device 1 in FIG. 1. In the substrate 200, the signal lines 105 are formed on the upper surface of a core member 201 which is a base substrate. The core member 201 has holes 202. Via side conductors 203 of copper etc., inside the holes 202, the signal lines 105 are electrically connected to signal lines 204 of copper etc., on the underside of the core member 201. The exposed surfaces of the signal lines 105 and 204, and the side conductors 203 are coated with solder resist 205. Reference numeral 209 denotes lands which are openings in the solder resist 205 on the signal lines 204. The PCB may be a resin substrate of glass epoxy resin or a ceramic substrate.

The metal balls 106 are electrically connected to the signal lines 204 via the lands 209. That is, the bonding pads 101A and 102A are electrically connected to the metal balls 106 via the bonding wires 104 and 103, the signal lines 105, the side conductors 203, and the signal lines 204. The openings 206 in the solder resist 205, which is layered on the signal lines 105, corresponds to the bonding pads 100A and 100B. In this description of the invention, a connection terminal means one of the metal ball 106, a connection ball 401, and the land 209 with no ball, which connects the semiconductor device and the external mount board.

Reference numeral 207 denotes a bonding member of adhesive tape or paste, which secures the underside of the SRAM chip 101 to the top side of the solder resist 205. Similarly, reference numeral 208 denotes another bonding member of adhesive tape or paste, which secures the top side of the SRAM chip 101 to the underside of the flash memory chip 102.

The connection structure shown in FIG. 3 will be explained. In this figure, reference numeral 300 denotes a tape which corresponds to the substrate 100 in FIG. 1. On the top side of a polyimide film 301, which is the base substrate, signal lines 105 are formed by a bonding member 302 of adhesive tape or paste. While in this embodiment the signal lines 105 are attached to the polyimide film 301 by the bonding member 302, the signal lines 105 may be formed directly on the polyimide film 301 without the bonding member 302. The polyimide film 301 has openings 303 through which the signal lines 105 are electrically connected to metal balls 106 via connection conductors 304 of copper. etc., which are formed inside the openings 303.

That is, the bonding pads 101A and 102A are electrically connected to the metal balls 106 via the bonding wires 104 and 103, the signal lines 105, and the connection conductors 304. The signal lines 105 are patterned, directly forming the bonding pads 100A and 100B.

Reference numeral 305 denotes a bonding member made of adhesive tape or paste, which secures the underside of the SRAM chip 101 to the top side of the solder resist 205. Similarly, reference numeral 306 denotes a bonding member of adhesive tape or paste, which secures the top side of the SRAM chip 101 to the underside of the flash memory chip 102.

Figure 4:
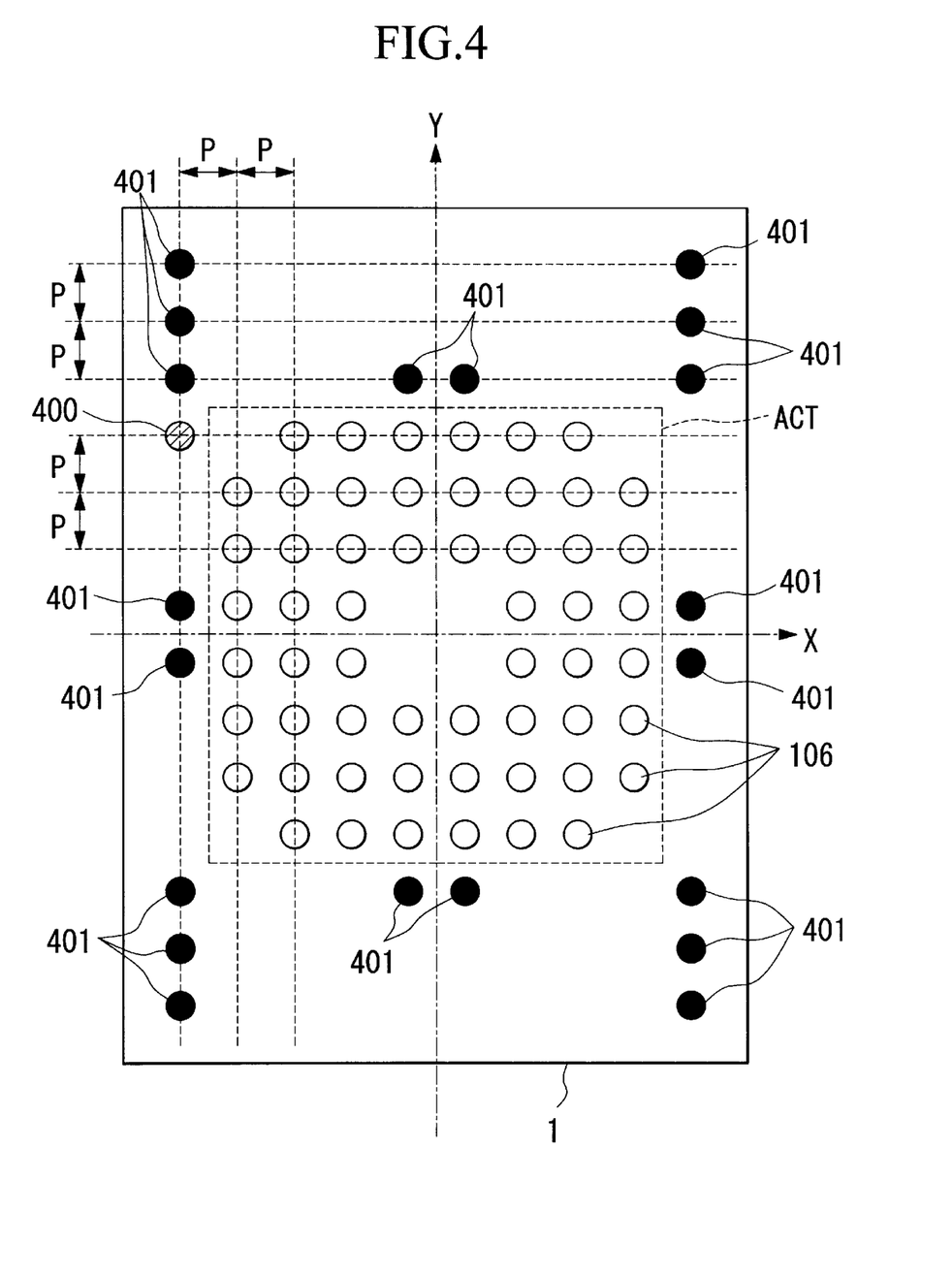
FIG. 4 is a bottom view showing the arrangement of metal balls of the semiconductor device of the present invention.

Referring now to FIG. 4, the positions of the solder balls 106 of the semiconductor device 1 will be explained. In an area ACT, 56 metal balls 106, which connect the bonding pads of the SRAM chip 101 to the bonding pads of the flash memory chip 102, form a grid array (in the form of a matrix). The pitch (regular interval) between the metal balls 106 is P, i.e., 0.8 mm. No metal ball is provided at the four corners of the grid array (corresponding to bump electrodes C in FIG. 10) and at the four grids nearest the center.

The advantage of this structure with no metal ball at the grids of the four corners is proved by tests on a sample semiconductor device 1 mounted on the board via the bump electrodes of the metal balls 106, i.e., a temperature cycle test repeating a cycle of temperature-rise and temperature-fall, and an impact test to demonstrate that it can survive a specific impact.

If the metal balls 106 are provided at the grids of the corners, they are affected, by the thermal stress in the temperature cycles, and the impact stress in the impact test, so that it is likely that the mount board and the semiconductor device 1 will be electrically or mechanically disconnected.

Therefore, in the arrangement of the bump electrodes of the semiconductor device 1, the metal balls 106 are connected to the semiconductor chip sealed in the package, avoiding the positions which are likely to cause disconnection.

As a result, the semiconductor device 1 decreases the stress on the corners. By dispersing the stress on the eight metal balls 106 nearest the corners, the connection strength becomes twice as high.

Reference numeral 400 denotes an index which is a mark, and which is not electrically connected to the bonding pads of the SRAM chip 101 and of the flash memory chip 102. The index 400 indicates a direction of the semiconductor device 1, and is provided asymmetrically. The index 400 may be an exposed land 209, a metal ball 106 or a connection ball 401, or may be printed with a laser. When the metal ball 106 or the connection ball 401 is provided at the index 400, the index 400 increases the connection strength between the mount board and the semiconductor device 1.

Reference numeral 401 denotes connection balls which are reinforcing bump electrodes, and which are not electrically connected to the bonding pads of the SRAM chip 101 and the flash memory chip 102. Some of the connection balls 401 may be connected thereto. The connection balls 401 are disposed on the bottom side near the edges of the semiconductor device 1, thus absorbing stress. Therefore, even if the metal balls are provided at the corners as bump electrodes C, the stress on the metal balls 106 within the area ACT can be reduced.

When no metal balls of the bump electrodes C are provided at the corners, the stress is dispersed on the eight corner metal balls, thus decreasing the disconnection rate.

Moreover, by providing the connection balls 401 apart from the area ACT, the bottom areas of the connection balls 401 can be greater than those of the metal balls 106, and this further improves the connection strength.

The pitch of the connection balls 401 is a regular interval of P, i.e., 0.8 mm, in a manner similar to the metal balls 106. The connection balls 401 may be arranged at an interval of integer multiples of P or of P divided by integers. The interval P may be appropriately determined, i.e., an integer multiple of the interval between grids of a CAD tool for designing the line pattern on the substrate 100 or the mount board.

Figure 5:
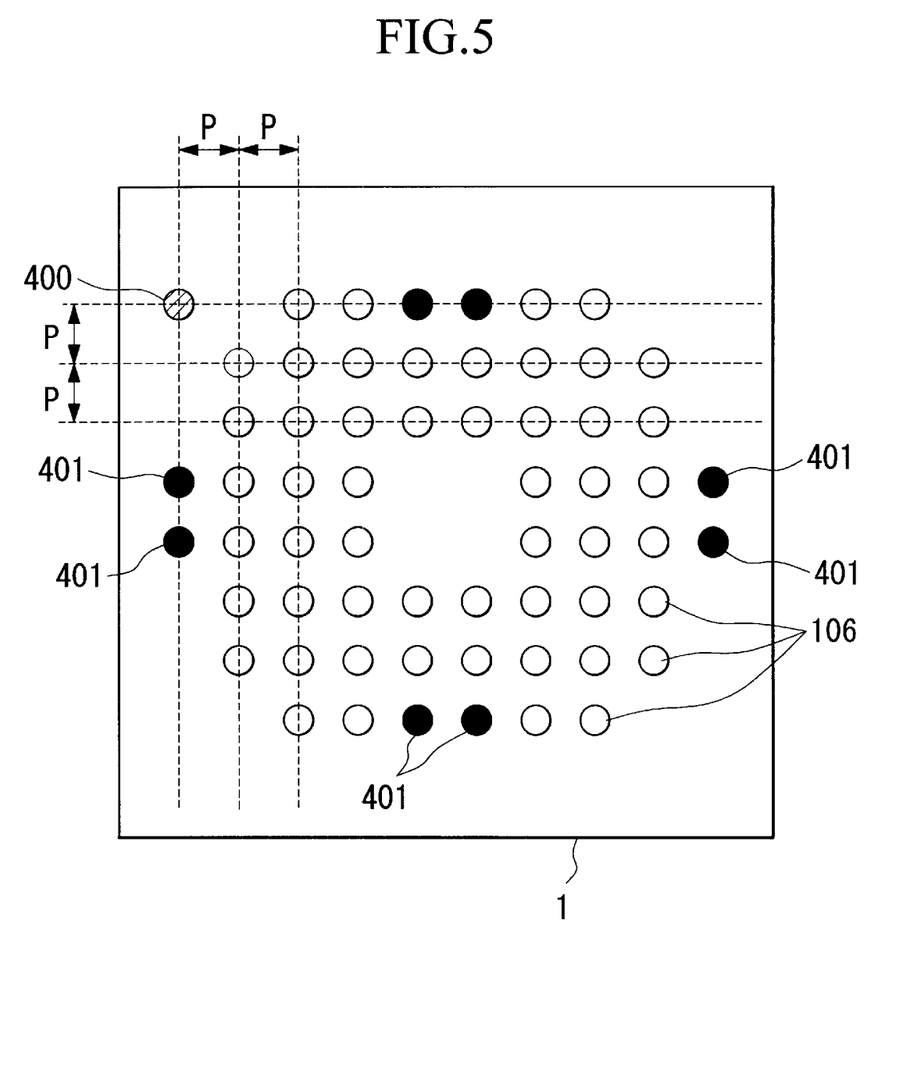
FIG. 5 is a bottom view showing the other arrangement of metal balls of the semiconductor device of the present invention.
Figure 6:
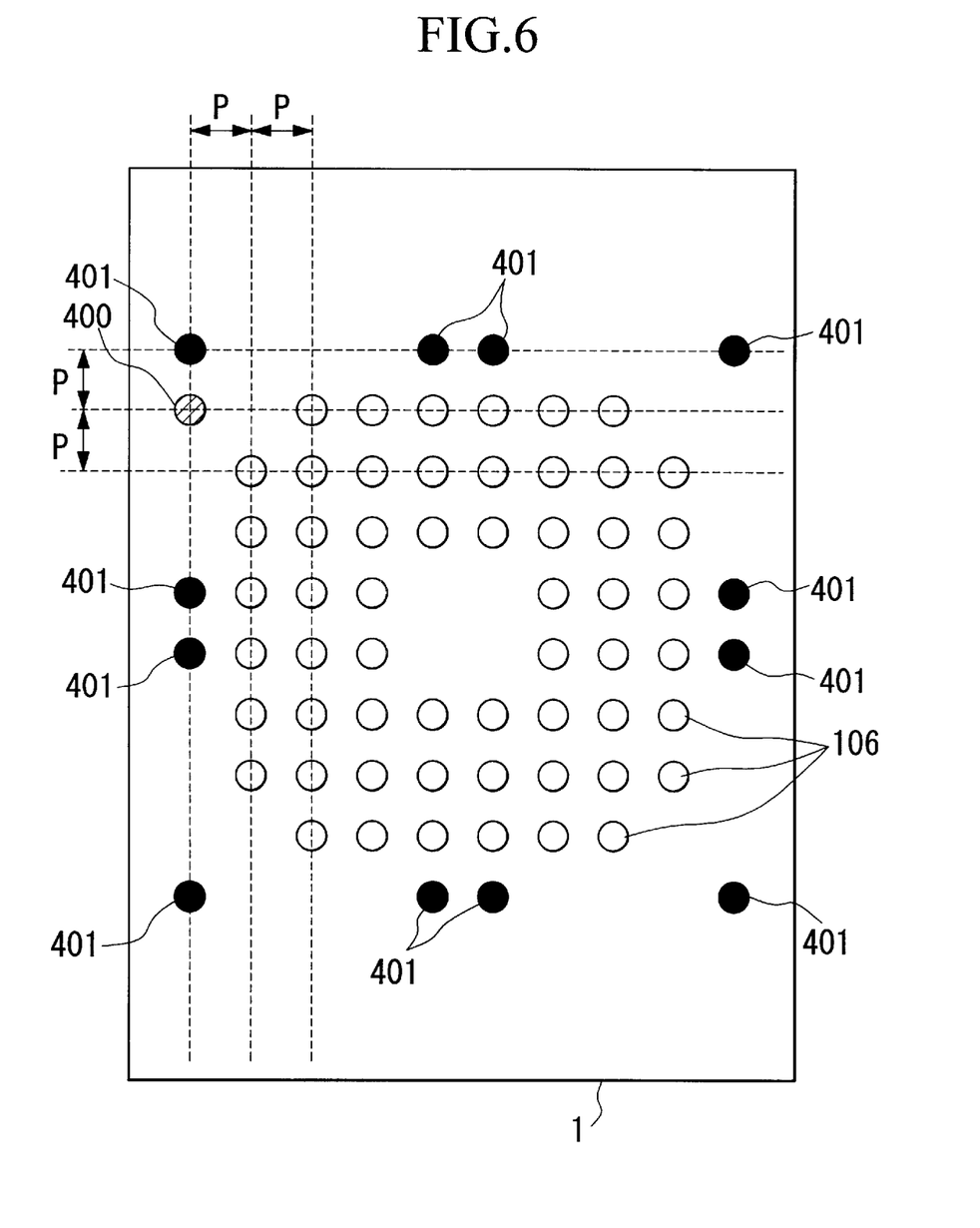
FIG. 6 is a bottom view showing the other arrangement of metal balls of the semiconductor device of the present invention.
Figure 7:
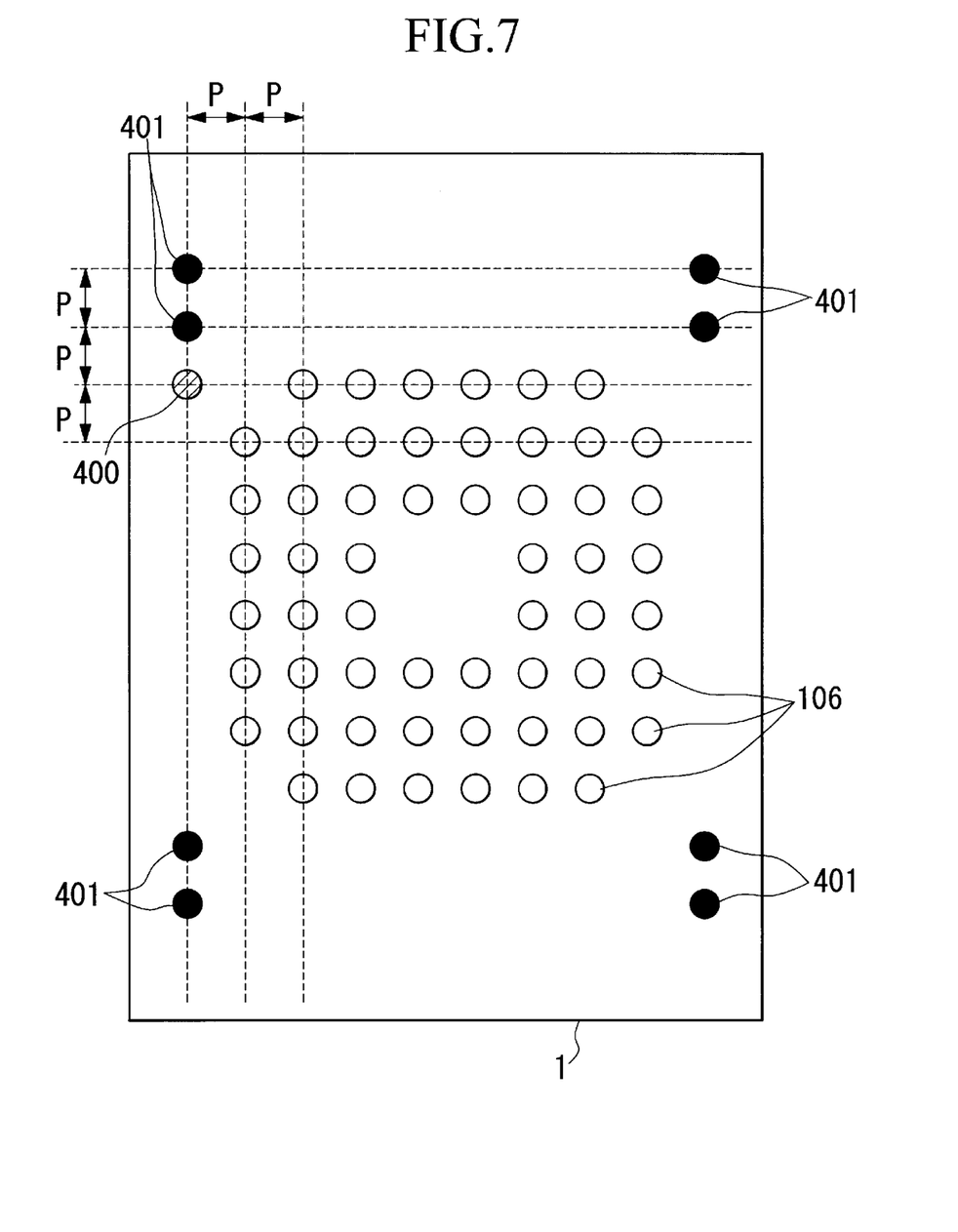
FIG. 7 is a bottom view showing the other arrangement of metal balls of the semiconductor device of the present invention.

The connection balls 401 may be positioned not near the edges as shown in FIG. 4 but near and inside the area ACT as shown in FIG. 5. In this situation, some of the connection balls 401 establish only mechanical connections, and not electrical connections with the semiconductor chips. The connection balls 401 are made of the same material as the metal balls 106. The connection balls 401 may be arranged as shown in FIGS. 6 and 7.

The connection balls 401 may not be arranged on the bottom side near the edges of the semiconductor device 1, and the metal balls 106 may form a grid array, avoiding the corners.

Moreover, the connection balls 401 are arranged on the bottom side near the edges of the semiconductor device 1, and the metal balls 106 may form a grid array including the four corners. The stress on the metal balls 106 at the four corners is absorbed by the connection balls 401 near the edges.

Figure 8:
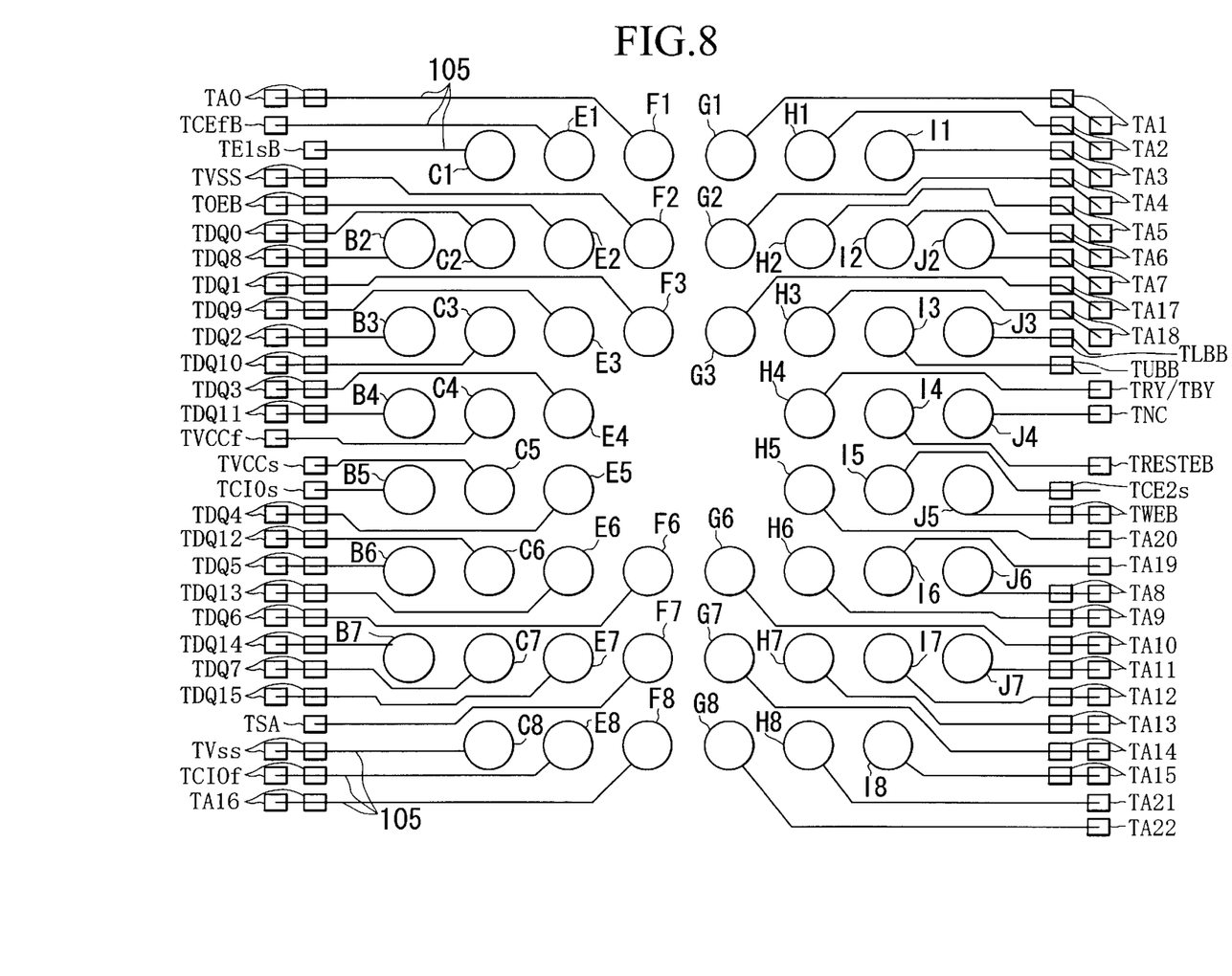
FIG. 8 is a diagram showing the electrical connections between the metal balls and bonding pads of a SRAM chip and of a flash memory chip 102 of the present invention.

Referring to FIG. 8, the relationship of the electrical connections between the metal balls 106 and the bonding pads of the SRAM chip 101 and of the flash memory chip 102 will be explained. FIG. 8 shows an upper surface of the substrate 100 of the semiconductor device 1 on which the SRAM chip 101 is mounted.

In this figure, reference characters B2–B7, C1–C8, E1–E8, F1–F3, F6–F8, G1–G3, G6–G8, H1–H8, I1–I8, and J2–J7 denote openings corresponding to the openings 202 shown in FIG. 2. On the underside of the substrate, the metal balls 106 are attached corresponding to the openings B2–B7, C1–C8, E1–E8, F1–F3, F6–F8, G1–G3, G6–G8, H1–H8, I1–I8, and J2–J7.

Reference characters TA0–TA22, TDQ0–TDQ15, TVSS, TVss, TSA, TNC, TVCCf, TVCCs, CIOf, CIOs, TRY/TBY, TRESETB, TWEB, TUB, TLB, TCEfB, TCE1sB, TCE2s, and TOEB denote bonding pads corresponding to the bonding pads 100A and 100B shown in FIG. 1.

The underside metal balls 106, corresponding to the openings B2–B7, C1–C8, E1–E8, F1–F3, F6–F8, G1–G3, G6–G8, H1–H8, I1–I8, and J2–J7, are electrically connected to the bonding pads TA0–TA22, TDQ0–TDQ15, TVSS, TVss, TSA, TNC, TVCCf, TVCCs, CIOf, CIOs, TRY/TBY, TRESETB, TWEB, TUB, TLB, TCEfB, TCE1sB, TCE2s, and TOEB via the signal lines 105 as shown in FIG. 8.

The character "B" at the end of the reference characters of some of the bonding pads means that a signal having a negative logic value is input thereto.

The bonding pads TA0–TA22, TDQ0–TDQ15, TVSS, TVss, TSA, TNC, VCCf, TVCCS, CIOf, CIOs, TRY/TBY, TRESETB, TWEB, TUB, TLB, TCEfB, CE1sB, TCE2s, and TOEB correspond to the bonding pads 100A and 100B, and are electrically connected via the bonding wires 103 or 104 (see FIG. 1) to the bonding ads of the SRAM chip 101 and of the flash memory chip 102.

To connect the bonding pads to the metal balls 106 corresponding to the openings by the signal lines 105, the intervals between two openings are determined so as to allow two signal lines 105 to pass therebetween.

The bonding pads TA0–TA22 are connected to the bonding pads of the SRAM chip 101 corresponding to address signals A0–A22. Similarly, the bonding pads TA0–TA22 are connected to the bonding pads of the flash memory chip 102 corresponding to address signals A0–A22. Some of the bonding pads may not be used, depending on the memory capacity of the semiconductor device 1. When using the address signals A0–A22, the memory may handle 128 megabits of data.

The bonding pads TDQ0–TDQ15 are connected to the bonding pads of the SRAM chip 101 corresponding to address signals DQ0–DQ15. Similarly, the bonding pads TDQ0–TDQ15 are connected to the bonding pads of the flash memory chip 102 corresponding to address signals DQ0–DQ15.

The data signals to/from the flash memory chip 102 are 16 bits of data DQ0–DQ15. When the bonding pad TCIOf receives the signal at a high level, 16 bits of data signals DQ0–DQ15 are output. When the bonding pad TCIOf receives the signal at a low level, 8 bits of data signals DQ0–DQ7 are output.

Similarly, the data signals to/from the SRAM chip 101 are 16 bits of data DQ0–DQ15. When the bonding pad TCIOs receives the signal at a high level, 16 bits of data signals DQ0–DQ15 are output. When the bonding pad TCIOs receives the signal at a low level, 8 bits of data signals DQ0–DQ7 are output.

The bonding pad TCEfB receives a signal CEBf to set the flash memory chip 102 to be enabled or disenabled. When the bonding pad TCEfB receives the signal CEfB at a low level, the flash memory chip 102 becomes enabled. When the bonding pad TCEfB receives the signal CEfB at a high level, the flash memory chip 102 becomes disenabled.

The bonding pad TCE1sB receives a signal CE1sB to set the SRAM chip 101 to be enabled or disenabled. When the bonding pad TCE1sB receives the signal CE1sB at a low level, the SRAM chip 101 becomes enabled. When the bonding pad TCE1sB receives the signal CE1sB at a high level, the SRAM chip 101 becomes disenabled.

The bonding pad TCE2s receives a signal CE2s to set the SRAM chip 101 to be enabled or disenabled. When the bonding pad TCE2s receives the signal CE2s at a high level, the SRAM chip 101 becomes enabled. When the bonding pad TCE2s receives the signal CE2s at a low level, the SRAM chip 101 becomes disenabled.

The bonding pad TOEB receives a signal OEB to set the output of the data signals DQ0–DQ15 from the flash memory chip 102 to be enabled or disenabled. When the bonding pad TOEB receives the signal OEB at the low level, the outputs of the data signals DQ0–DQ15 from the flash memory chip 102 become enabled. When the bonding pad TOEB receives the signal OEB at a high level, the outputs of the data signals DQ0–DQ15 from the flash memory chip 102 become disenabled.

The bonding pad TWEB receives a signal WEB at a low level to store data in the SRAM chip 101 and the flash memory chip 102.

The bonding pads TLBB and TUBB receive signals LBB and UBB which assist addressing for data when handling the lower bytes of data DQ0–DQ7 and the upper bytes of data DQ8–DQ15 separately.

The bonding pads TVss and TVSS receive the power VSS for the SRAM chip 101 and the flash memory chip 102. The bonding pad TVCCf receives the power VCC for the flash memory chip 102. The bonding pad TVCCs receives the power VCC for the SRAM chip 101.

The bonding pad TNC receives a signal for a special function (e.g., a write disenable function, or a test) of the SRAM chip 101 and the flash memory chip 102, and is not connected usually.

The bonding pad TRESETB receives a reset signal for the SRAM chip 101 and the flash memory chip 102. When the reset signal at a low level is input, the SRAM chip 101 and the flash memory chip 102 are reset and initialized.

The bonding pads TRY/TBY output a signal TRY/TBY to detect whether the flash memory chip 102 is automatically executing an algorithm or not. That is, when the chip is performing a write or erase process, the output signal TRY/TBY becomes zero. When the automatic algorithm process is on standby, the output signal TRY/TBY becomes 1.

The bonding pad TSA receives an address signal for the SRAM chip 101. When the input/output to/from the SRAM chip 101 is performed on an 8 bit basis (controlled by a control signal CIOs), an address signal is input. When the input/output to/from the SRAM chip 101 is performed on an 16 bit basis, the terminal is disenabled.

In FIG. 8, according to the arrangement of the lands 209 and the metal balls 106, the terminal for power supply Vccf to the flash memory chip 102 and the terminal for power supply terminal Vccs to the SRAM chip 101 are close to each other, so that the terminals for power supply Vcc to the flash memory chip 102 and to the SRAM chip 101 can be easily connected to a common source. When a single power source terminal, whose size covers the lands C4 and C5, is provided on a board to which the semiconductor device 1 is mounted, it is easy to apply the same power voltage to both terminals.

In FIG. 8, according to the arrangement of the lands 209 and the metal balls 106, the terminal for byte-switch (CIOs) for the SRAM chip 101 is positioned close to the terminal for power supply Vccs. Therefore, it is easy to set the byte-switch terminal to a high (H) level, that is, to select a word (16 bits) mode. When a single power supply terminal, whose size covers the terminals C5 and B5, is provided on a board, the word mode is selected by applying the power (Vcc) to the power supply terminal.

In FIG. 8, according to the arrangement of the lands 209 and the metal balls 106, the data terminal DQ15 of the flash memory chip 102 and the data terminal SA of the SRAM chip 101 are close to each other, so that the flash memory chip 102 and the SRAM chip 101 are easily set to an 8 bit mode together. When a single power supply terminal, whose size covers the terminals E7 and F8, is provided on the board, it is easy to set the flash memory chip 102 and the SRAM chip 101 to the 8 bit mode together by applying a voltage at a low (L) level to the single power supply terminal.

Figure 9:
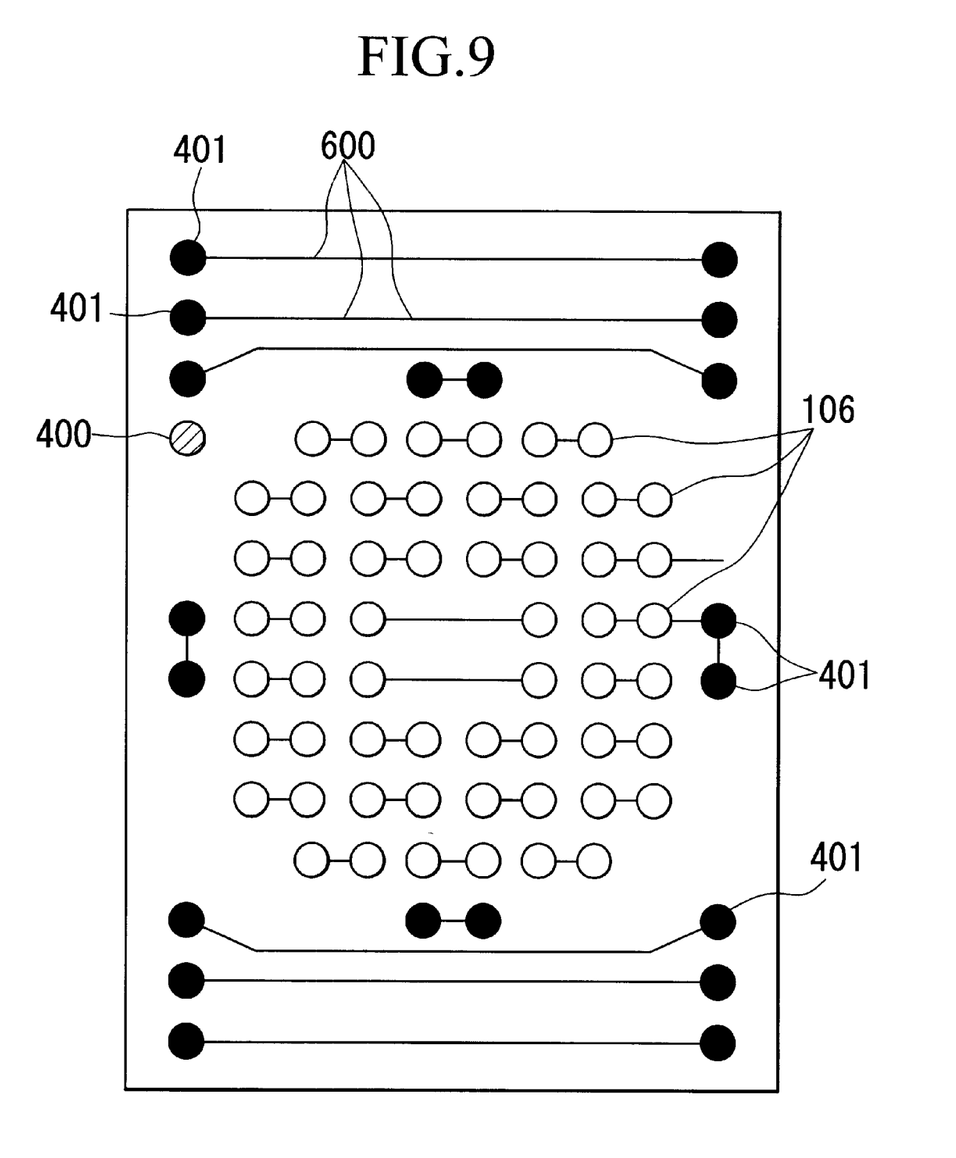
FIG. 9 is a diagram showing the connections to check the quality of the connections which undergo a stress test on bump electrodes of the present invention.

FIG. 9 shows a signal line pattern on a sample substrate 100 (FIG. 1) for the temperature cycle test and the impact test. The signal lines 600 and signal lines on the other component mounting side, which is not shown, form a daisy chain (electric current line connecting all the solder balls in series on the back side of the substrate). In the tests, a stress is applied to the substrate, and the electrical connections between all the solder balls are checked.

Although the present invention is described in detail by way of the embodiment, the invention is not limited to this, and modifications, such as simple design changes which fall within the scope of the invention, are included in this invention.

For instance, while the stacked semiconductor chips are the SRAM chip and the flash memory chip, other semiconductor chips may be used.

The structure of the present invention can be applied to bump electrodes of other semiconductor devices, i.e., in which semiconductor chips are not stacked, are arranged side by side on the substrate in a single package.

In addition, the structure of the present invention can be applied to bump electrodes of a semiconductor device 1 which contains a single chip in a single package.

The structure of the present invention can be applied to an LGA (land-grid-array) with bump electrodes which are formed by providing solder on the mount board and connecting the lands 209 to the solder, and which eliminates the metal balls 106 from the semiconductor device shown in FIG. 2. In this modification, the lands 209 form a grid array, avoiding the corners of the array. On the underside of the semiconductor device 1, reinforcing lands for solder balls must be provided.

According to the present invention, because the solder balls are excluded from the corners of the grid array, disconnection of the bump electrodes near the corners due to a stress arising from a change in temperature or an impact can be avoided, and a defective electrical connection can be eliminated.

Moreover, because the solder balls, which are not connected to the semiconductor chip, are provided on the underside of the semiconductor device to absorb a stress arising from a change in temperature or an impact, a stress on the solder balls can be reduced, disconnection of the bump electrodes can be avoided, and a defective electrical connection can be eliminated.

Moreover, because the metal balls forms the grid array in the area ACT in positions other than the corners and the center area, the number of the signal lines between the lands is limited to two or less while the number of the metal balls is not increased. Therefore, the semiconductor device can be reliably manufactured in a normal process using a normal material, eliminating advanced processes or use of expensive materials. Because the number of lines between the lands is decreased, the signal lines become wider, reducing the connection resistance, and the deterioration of the electric characteristics and disconnection of the lines can be avoided. Thus, the present invention improves the connection strength, simplifies the connections, and reduces the costs, without increasing the number of the balls.

Moreover, because the connection balls are provided outside the area ACT, a stress on the metal balls in the area ACT is reduced, thereby preventing disconnection, and making the design of signal lines and the manufacturing process easy.

Moreover, when designing an electronic device system using two or more semiconductor devices, the area to be occupied by two or more semiconductor chips is reduced because the semiconductor chips are stacked. When two or more semiconductor memory chips are stacked, the storage capacity is increased without increasing the area occupied by the chips. When the semiconductor chips, whose operations and functions differ from each other, can switch the width (length) of input/output data (e.g., a byte width, or a bit width), it is easy to meet users' demands without preparing various types of semiconductor devices with different byte widths.

When stacking two or more chips, the bonding pads with the same functions of, i.e., receiving the same address signals or data signals, are positioned close to each other. This design simplifies the connections, reduces the number of the metal balls, and reduces the size of the package, without increasing the number of the bonding pads on the substrates. Thus, the electronic device system using the semiconductor device of the invention reduces its size, and improves the efficiency of the manufacturing process.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor device comprising:
    a substrate;
    an IC chip provided on one side of said substrate;
    a plurality of connection terminals provided on another side of said substrate, said connection terminals are electrically connected to said IC chip through electrical connecting devices, said connection terminals form a rectangular grid array, and are arranged in positions other than corners of the array; and
    reinforcement terminals which are provided outside the grid array on the same side of said substrate as the connection terminals, and said reinforcement terminals are made of non-conductive material.

2. A semiconductor device comprising:
    a substrate having a first side and a second side;
    an IC chip provided on the first side of said substrate;
    a plurality of connection terminals provided on the second side of said substrate, wherein said connection terminals are electrically connected to said IC chip to form a rectangular grid array; and
    reinforcement terminals which are provided outside the grid array on the second side of said substrate, and are made of non-conductive material.

3. A semiconductor device according to claim 2, wherein said connection terminals are not provided in corner portions of the grid array.

4. A semiconductor device according to any one of claims 1 to 3, wherein said connection terminals are conductors electrically and mechanically connected to a board to which said semiconductor device is mounted.

5. A semiconductor device according to claim 4, wherein said conductors are made of solder or tin alloy.

6. A semiconductor device according to claim 4, wherein said connection terminals are spherical and parts of said spheres protrude from the second side of said substrate.

7. A semiconductor device according to any one of claims 1 to 3, wherein a part of said connection terminals is not electrically connected to said IC chip.

8. A semiconductor device according to any one of claims 1 or 2, wherein said reinforcement terminals are aligned along at least one of the row direction and the column direction.

9. A semiconductor device according to any one of claims 1 to 3, wherein said connection terminals are excluded from the center of the grid array.

10. A semiconductor device according to any one of claims 1 to 3, wherein said connection terminals are arranged at a regular pitch P.

11. A semiconductor device according to claim 10, wherein said reinforcement terminals are arranged at an interval of integer multiples of the pitch P or of the pitch P divided by an integer.

12. A semiconductor device according to claim 10, wherein an interval between said connection terminals and said reinforcement terminals is an integer multiple of P or of P divided by an integer.

13. A semiconductor device according to any one of claims 1 or 2, wherein at least one of said reinforcement terminals is an index terminal.

14. A semiconductor device according to any one of claims 1 to 3, wherein said connection terminals are electrically connected to said IC chip through conductors provided in said substrate.

* * * * *